United States Patent
Kim

(10) Patent No.: US 11,709,610 B2
(45) Date of Patent: Jul. 25, 2023

(54) MEMORY SYSTEM, MEMORY CONTROLLER AND OPERATING METHOD

(71) Applicant: SK hynix Inc., Gyeonggi-do (KR)

(72) Inventor: Kwang Su Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 75 days.

(21) Appl. No.: 16/842,947

(22) Filed: Apr. 8, 2020

(65) Prior Publication Data

US 2021/0117119 A1    Apr. 22, 2021

(30) Foreign Application Priority Data

Oct. 16, 2019   (KR) .................. 10-2019-0128257

(51) Int. Cl.
G06F 3/06          (2006.01)
G11C 11/56        (2006.01)
G11C 16/10        (2006.01)

(52) U.S. Cl.
CPC .......... *G06F 3/0644* (2013.01); *G06F 3/0604* (2013.01); *G06F 3/064* (2013.01); *G06F 3/0659* (2013.01); *G06F 3/0673* (2013.01); *G11C 11/5628* (2013.01); *G11C 16/10* (2013.01)

(58) Field of Classification Search
CPC ...... G06F 3/0644; G06F 3/0604; G06F 3/064; G06F 3/0659; G06F 3/0673; G11C 11/5628; G11C 16/10
See application file for complete search history.

(56) References Cited

U.S. PATENT DOCUMENTS

| | | | | |
|---|---|---|---|---|
| 2012/0297121 A1* | 11/2012 | Gorobets | ............ | G06F 12/0246 711/E12.008 |
| 2014/0003142 A1* | 1/2014 | Lee | .............. | G11C 11/5621 365/185.03 |
| 2014/0185376 A1* | 7/2014 | Sinclair | ................ | G06F 3/0658 365/185.03 |
| 2014/0380122 A1* | 12/2014 | Myung | ............... | G06F 11/1008 714/764 |
| 2016/0077745 A1* | 3/2016 | Patel | .................... | G06F 3/0619 714/704 |
| 2016/0179559 A1* | 6/2016 | Senda | ................. | G06F 9/45545 718/1 |
| 2016/0267014 A1* | 9/2016 | Doi | .................... | G11C 11/1675 |

(Continued)

FOREIGN PATENT DOCUMENTS

| | | |
|---|---|---|
| KR | 10-2013-0127207 | 11/2013 |
| KR | 10-2017-0131376 | 11/2017 |
| KR | 10-2018-0031289 | 3/2018 |

*Primary Examiner* — Tim T Vo
*Assistant Examiner* — Janice M. Girouard
(74) *Attorney, Agent, or Firm* — IP & T Group LLP

(57) ABSTRACT

A memory system, a memory controller and an operating method are disclosed. A first area, a second area included in the first area, and a third area are set. An area to which target data is to be written is determined to the first area or the third area. When the target data is written to the first area, the target data is preferentially written to the second area. The number of data bits stored per memory cell in the first area is less than the number of data bits stored per memory cell in the third area. As a consequence, it is possible to secure storage capacity of the memory system to at least a set reference while securing data write performance of the memory system recognized by a host to at least a set reference.

17 Claims, 17 Drawing Sheets

(56) References Cited

U.S. PATENT DOCUMENTS

| | | | |
|---|---|---|---|
| 2016/0364337 A1* | 12/2016 | Hale | G06F 12/0897 |
| 2017/0180478 A1* | 6/2017 | Hashimoto | G06F 12/0246 |
| 2018/0129424 A1* | 5/2018 | Confalonieri | G06F 13/1673 |
| 2019/0220218 A1* | 7/2019 | Deshe | G06F 3/0679 |
| 2020/0167089 A1* | 5/2020 | Natarajan | G11C 16/10 |

* cited by examiner data is migrated while memory controller is in idle state

MEMORY SYSTEM, MEMORY CONTROLLER AND OPERATING METHOD

CROSS-REFERENCE TO RELATED APPLICATION

The present application claims priority under 35 U.S.C. 119(a) to Korean Patent Application No. 10-2019-0128257, filed on Oct. 16, 2019, which is incorporated herein by reference in its entirety.

BACKGROUND

1. Technical Field

Various embodiments generally relate to a memory system, a memory controller and an operating method.

2. Related Art

A memory system operating as a storage device stores data based on a request of a host, such as a computer, a mobile terminal such as a smartphone or a tablet, or any of various other electronic devices. The memory system may be of a type which stores data in a magnetic disk, such as a hard disk drive (HDD), or a type which stores data in a nonvolatile memory, such as a solid state drive (SDD), a universal flash storage (UFS) device and an embedded MMC (eMMC) device.

The memory system may further include a memory controller for controlling a memory device (e.g., a volatile memory/a nonvolatile memory). The memory controller may receive a command from the host, and may perform or control an operation for reading, writing or erasing data with respect to the memory device in the memory system, based on the received command. The memory controller may drive firmware for performing logical calculations to execute or control these operations.

When the memory system writes data to the memory device based on a command received from the host, the data write performance of the memory system recognized by the host may vary depending on which area in the memory device to write data and how to migrate written data.

SUMMARY

Various embodiments are directed to a memory system, a memory controller and an operating method capable of securing storage capacity of the memory system to at least a set reference while securing data write performance of the memory system recognized by a host to at least a set reference.

In one aspect, embodiments of the disclosure may provide a memory system including: a memory device including a plurality of memory blocks; and a memory controller configured to control the memory device.

The memory controller may set a first area which includes a first subset of the plurality of memory blocks, a second area within the first area, and a third area which includes a second subset of the plurality of memory blocks.

The memory controller may determine whether target data is to be written to the first area or third area. When the target data is written to the first area, the memory controller may preferentially write the target data to the second area in the first area.

The number of data bits stored per memory cell in the first area may be less than the number of data bits stored per memory cell in the third area.

Each memory cell in the first area may be a single level cell (SLC) which stores 1 bit of data.

Each memory cell in the third area may store 2 or more bits of data.

When the number of free memory blocks in the first area or the third area is less than a threshold number of free memory blocks or a size of a first writable area in the first area is smaller than a first threshold area size, the memory controller may determine whether to perform garbage collection for the memory blocks in the first area or the third area, before determining whether the target data is to be written to the first area or the third area.

When the number of free memory blocks in the first area or the third area is equal to or greater than a threshold number of free memory blocks or a size of a first writable area in the first area is equal to or larger than a first threshold area size, the memory controller may determine whether the target data is to be written to the first area or the third area, based on at least one of i) a valid data percentage indicating a percentage of an area in which valid data is stored in each of the first area and the third area and ii) a size of a second writable area in the second area.

When the memory controller is in an idle state, the memory controller may migrate data from the first area to the third area.

Data stored in the second area may be preferentially migrated to a portion of the first area not overlapping with the second area.

In another aspect, embodiments of the disclosure may provide a memory controller including: a memory interface configured to communicate with a memory device including a plurality of memory blocks; and a control circuit configured to control the memory device.

The control circuit may set a first area which includes a first subset of the plurality of memory blocks, a second area within the first area, and a third area which includes a second subset of the plurality of memory blocks.

The control circuit may determine whether the target data is to be written to the first area or the third area. When the target data is written to the first area, the control circuit may preferentially write the target data to the second area in the first area.

The number of data bits stored per memory cell in the first area may be less than the number of data bits stored per memory cell in the third area.

Each memory cell in the first area may be a single level cell (SLC) which stores 1 bit of data.

Each memory cell in the third area may store 2 or more bits of data.

When the number of free memory blocks in the first area or the third area is less than a threshold number of free memory blocks or a size of a first writable area in the first area is smaller than a first threshold area size, the control circuit may determine whether to perform garbage collection for the memory blocks in the first area or the third area, before determining whether the target data is to be written to the first area or the third area.

When the number of free memory blocks in the first area or the third area is equal to or greater than a threshold number of free memory blocks or a size of a first writable area in the first area is equal to or larger than a first threshold area size, the control circuit may determine whether the target data is to be written to the first area or the third area, based on at least one of i) a valid data percentage indicating a percentage of an area in which valid data is stored in each of the first area and the third area and ii) a size of a second writable area in the second area.

When the memory controller is in an idle state, the control circuit may migrate data from the first area to the third area.

Data stored in the second area among data stored in the first area may be preferentially migrated to a portion of the first area not overlapping with the second area.

In still another aspect, embodiments of the disclosure may provide a method for operating a memory controller, including: setting a first area which includes a first subset of a plurality of memory blocks in a memory device, a second area within the first area, and a third area which includes a second subset of the plurality of memory blocks.

The method for operating a memory controller may include determining whether target data is to be written to the first area or the third area.

When the target data is written to the first area, the target data may be preferentially written to an area which overlaps with the second area.

The number of data bits stored per memory cell in the first area may be less than the number of data bits stored per memory cell in the third area.

In still another aspect, embodiments of the disclosure may provide a method for operating a controller for controlling a memory device including a low storage capacity cell region and a high storage capacity cell region, the low storage capacity cell region including a priority region.

The method for operating a controller may include storing, in response to a write request, write data in the low storage capacity cell region when a writable area within the priority region is greater than a first threshold and an amount of valid data stored in the low storage capacity cell region is less than a second threshold.

The method for operating a controller may include migrating, when the memory device is idle, data from the low capacity storage region to the high storage capacity cell region.

The write data may be preferentially stored in the priority region and may be preferentially migrated from the priority region to the higher storage capacity cell region.

According to the embodiments of the disclosure, it is possible to secure storage capacity of the memory system to at least a set reference while securing data write performance of the memory system recognized by a host to at least a set reference.

DETAILED DESCRIPTION

Various embodiments of the disclosure are described in detail below with reference to the accompanying drawings. Throughout the specification, reference to "an embodiment," "another embodiment" or the like is not necessarily to only one embodiment, and different references to any such phrase are not necessarily to the same embodiment(s). Similarly, the indefinite articles "a" and "an" mean one or more, unless stated otherwise or it is clear from the context that only one is intended.

Figure 1:
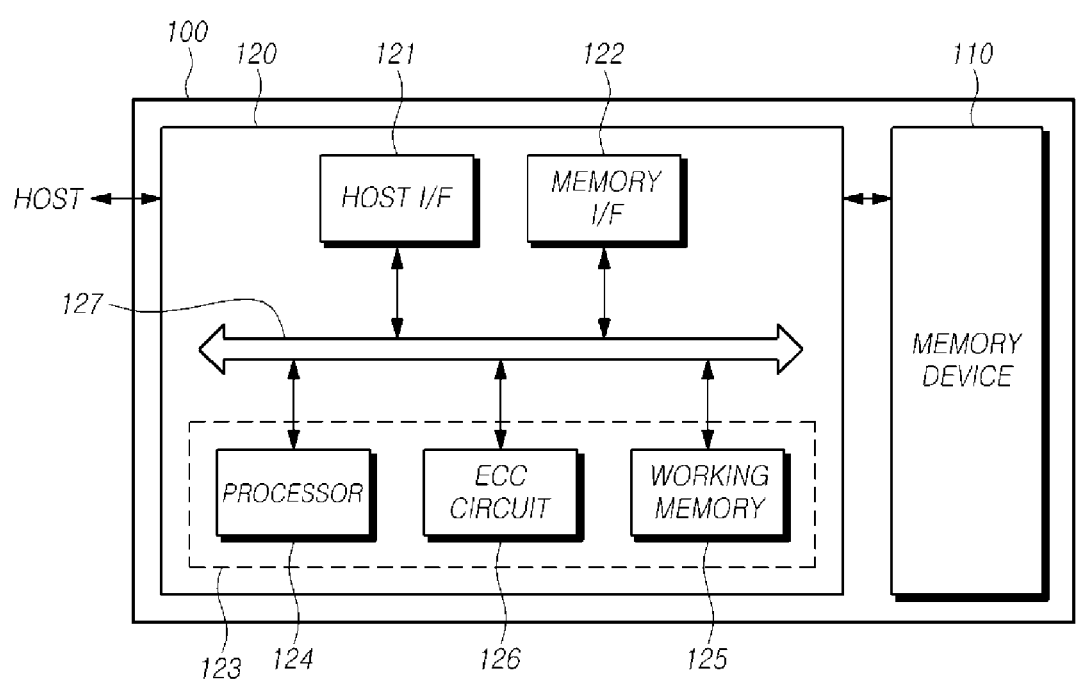
FIG. 1 is a schematic diagram illustrating a configuration of a memory system in accordance with an embodiment of the disclosure.

FIG. 1 is a schematic diagram illustrating a memory system 100 in accordance with an embodiment of the disclosure.

Referring to FIG. 1, the memory system 100 may include a memory device 110 which stores data, and a memory controller 120 which controls the memory device 110.

The memory device 110 includes a plurality of memory blocks, and operates in response to the control of the memory controller 120. Operations of the memory device 110 may include, for example, a read operation, a program operation (also referred to as a write operation) and an erase operation.

The memory device 110 may include a memory cell array including a plurality of memory cells (also simply referred to as "cells") which store data. Such a memory cell array may be disposed in memory blocks.

For example, the memory device 110 may be realized as any of various types such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM) and/or a spin transfer torque random access memory (SU-RAM).

The memory device 110 may be realized in a three-dimensional array structure. Embodiments of the disclosure may be applied to not only a flash memory device in which a charge storage layer is configured by a conductive floating gate but also a charge trap flash (CTF) in which a charge storage layer is configured by a dielectric layer.

The memory device 110 is configured to receive a command, an address and the like from the memory controller 120 and access a region in the memory cell array which is selected by the address. In other words, the memory device 110 may perform an operation corresponding to the command, for a region selected by the address.

For example, the memory device 110 may perform a program operation, a read operation and an erase operation. In the program operation, the memory device 110 may program data in a region selected by the address. In the read operation, the memory device 110 may read data from a region selected by the address. In the erase operation, the memory device 110 may erase data stored in a region selected by the address.

The memory controller 120 may control write (program), read, erase and background operations for the memory device 110. For example, the background operation may include at least one among a garbage collection (GC) operation, a wear leveling (WL) operation, a bad block management (BBM) operation, and the like.

The memory controller 120 may control the operation of the memory device 110 according to a request of a host. The memory controller 120 may also control the operation of the memory device 110 even in the absence of a request of the host.

The memory controller 120 and the host may be separate devices or components. Alternatively, the memory controller 120 and the host may be integrated into a single device. By way of example, the following description is given in the context of the memory controller 120 and the host being separate devices or components.

Referring to FIG. 1, the memory controller 120 may include a memory interface 122 and a control circuit 123, and may further include a host interface 121.

The host interface 121 provides an interface for communication with the host.

When receiving a command from the host, the control circuit 123 may receive the command through the host interface 121, and then, may perform an operation of processing the received command.

The memory interface 122 is coupled with the memory device 110 and thereby provides an interface for communication with the memory device 110. That is to say, the memory interface 122 may be configured to provide the interface between the memory device 110 and the memory controller 120 in response to the control of the control circuit 123.

The control circuit 123 performs the general control operations of the memory controller 120, thereby controlling the operations of the memory device 110. To this end, for instance, the control circuit 123 may include at least one of a processor 124 and a working memory 125, and as the case may be, may further include an error detection and correction circuit (ECC circuit) 126.

The processor 124 may control general operations of the memory controller 120, and may perform a logic calculation. The processor 124 may communicate with the host through the host interface 121, and may communicate with the memory device 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the received logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 is configured to randomize data received from the host. For example, the processor 124 may randomize data received from the host, by using a randomizing seed. Randomized data as data to be stored is provided to the memory device 110 and is programmed to the memory cell array.

The processor 124 is configured to derandomize data received from the memory device 110, in a read operation. For example, the processor 124 may derandomize data received from the memory device 110, by using a derandomizing seed. Derandomized data may be outputted to the host.

The processor 124 may control the operation of the memory controller 120 by executing firmware. In other words, in order to control general operations of the memory controller 120 and perform a logic calculation, the processor 124 may execute (drive) firmware loaded to the working memory 125 upon booting.

The firmware as a program to be executed in the memory system 100 may include various functional layers.

For example, the firmware may include at least one among a flash translation layer (FTL) which performs a translating function between a logical address requested to the memory system 100 from the host and a physical address of the memory device 110, a host interface layer (HIL) which serves to analyze a command requested to the memory system 100 as a storage device from the host and transfer the command to the flash translation layer (FTL), and a flash interface layer (FIL) which transfers a command instructed from the flash translation layer (FTL) to the memory device 110.

For instance, such a firmware may be stored in the memory device 110 and then be loaded to the working memory 125.

The working memory 125 may store a firmware, a program code, a command and data to drive the memory controller 120. The working memory 125, for example, as a volatile memory, may include at least one among an SRAM (static RAM), a DRAM (dynamic RAM) and an SDRAM (synchronous DRAM).

The error detection and correction circuit 126 may be configured to detect an error bit of target data and correct the detected error bit, by using an error correction code. Here, the target data may be, for example, data stored in the working memory 125, data read from the memory device 110, or the like.

The error detection and correction circuit 126 may be realized to decode data by using an error correction code. The error detection and correction circuit 126 may be realized by any of various code decoders. For example, a decoder which performs unsystematic code decoding or a decoder which performs systematic code decoding may be used.

For example, the error detection and correction circuit 126 may detect error bit(s) for each read data, in the unit of sector. Namely, each read data may be constituted by a plurality of sectors. A sector may mean a data unit smaller than a page as a read unit of a flash memory. Sectors constituting each read data may be matched with one another by the medium of an address.

The error detection and correction circuit 126 may calculate a bit error rate (BER), and may determine whether an error is correctable or not, in the unit of sector. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 126 may determine that a corresponding sector is correctable or a pass.

The error detection and correction circuit 126 may perform an error detection and correction operation sequentially for all read data. When a sector included in read data is correctable, the error detection and correction circuit 126 may omit an error detection and correction operation for a corresponding sector for next read data. If the error detection and correction operation for all read data is ended in this way, the error detection and correction circuit 126 may detect a sector which is determined to be uncorrectable to the last. There may be one or more sectors that are determined to be uncorrectable. The error detection and correction circuit 126 may transfer an information (for example, an address information) on a sector which is determined to be uncorrectable, to the processor 124.

A bus 127 may be configured to provide channels among the components 121, 122, 124, 125 and 126 of the memory controller 120. The bus 127 may include, for example, a control bus for transferring various control signals, commands and the like, and a data bus for transferring various data.

The above-described components 121, 122, 124, 125 and 126 of the memory controller 120 are exemplary. One or more of these components may be omitted, and/or two or more of such components may be integrated into one. Of course, the memory controller 120 may include one or more other components.

The memory device 110 is described in further detail below with reference to FIG. 2.

Figure 2:
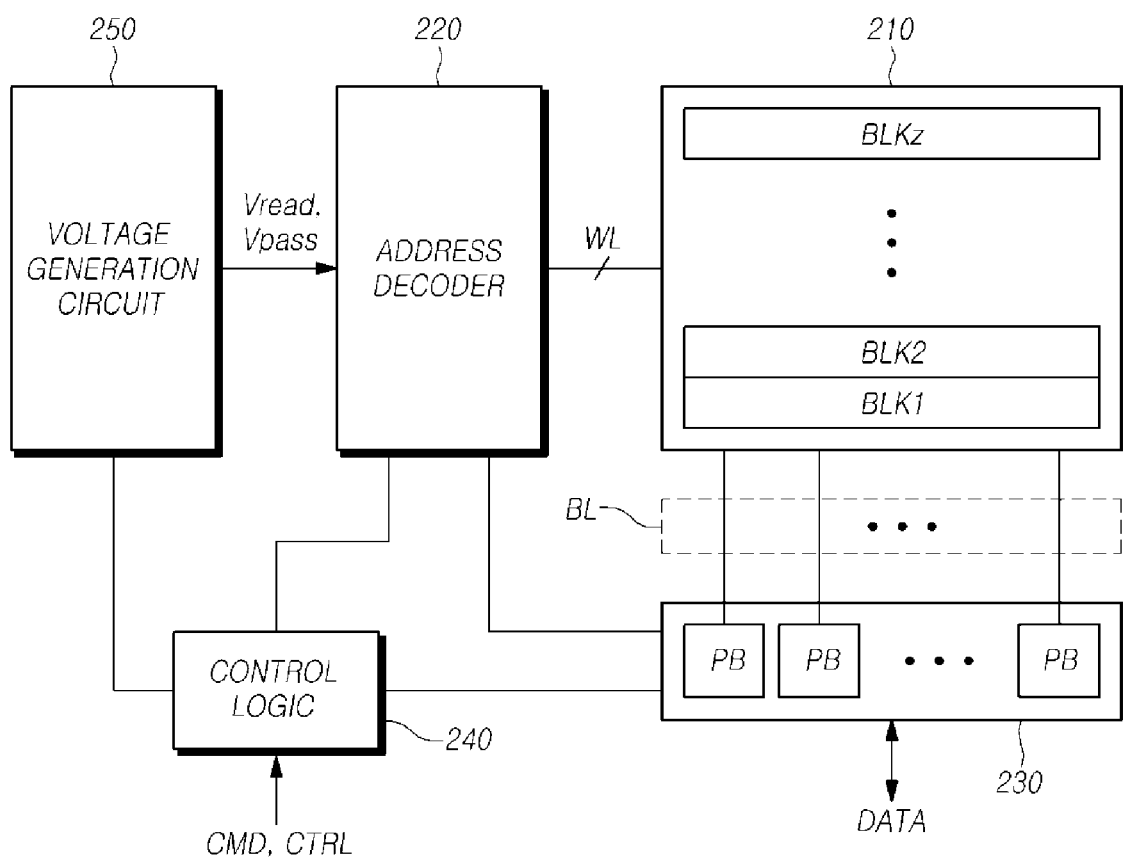
FIG. 2 is a block diagram schematically illustrating a memory device in accordance with an embodiment of the disclosure.

FIG. 2 is a block diagram schematically illustrating the memory device 110 in accordance with an embodiment of the disclosure.

Referring to FIG. 2, the memory device 110 may include a memory cell array 210, an address decoder 220, a read and write circuit 230, control logic 240, and a voltage generation circuit 250.

The memory cell array 210 may include a plurality of memory blocks BLK1 to BLKz (z is a natural number of 2 or greater).

In the plurality of memory blocks BLK1 to BLKz, a plurality of word lines WL and a plurality of bit lines BL may be disposed in an intersecting pattern, and a plurality of memory cells (MC) may be arranged at the intersections.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, which have vertical channel structures.

The memory cell array 210 may be configured as a two-dimensional structure, or a three-dimensional structure.

Each of the plurality of memory cells included in the memory cell array 210 may store at least 1-bit data. For instance, each of the plurality of memory cells in the memory cell array 210 may be a single level cell (SLC) which stores 1-bit data, a multi-level cell (MLC) which stores 2-bit data, a triple level cell (TLC) which stores 3-bit data, or a quad level cell (QLC) which stores 4-bit data. In another embodiment, the memory cell array 210 may include a plurality of memory cells, each of which stores 5 or more-bit data.

Referring to FIG. 2, the address decoder 220, the read and writhe circuit 230, the control logic 240 and the voltage generation circuit 250 may operate as peripheral circuits which drive the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory device 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block in a read voltage applying operation during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory device 110 may be performed in the unit of page. An address received when a read operation or a program operation is requested may include at least one among a block address, a row address and a column address.

The address decoder 220 may select one memory block and one word line depending on a block address and a row address. A column address may be decoded by the address decoder 220 and be provided to the read and write circuit 230.

The address decoder 220 may include at least one among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit which includes a plurality of page buffers PB. The read and write circuit 230 may include data buffers which operate in a data processing function, and as the case may be, may further include cache buffers which perform a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, that the amounts of current flowing depending on the programmed states of the corresponding memory cells are changed.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory device 110. In an embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory device 110.

The control logic 240 may be configured to control general operations of the memory device 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Figure 3:
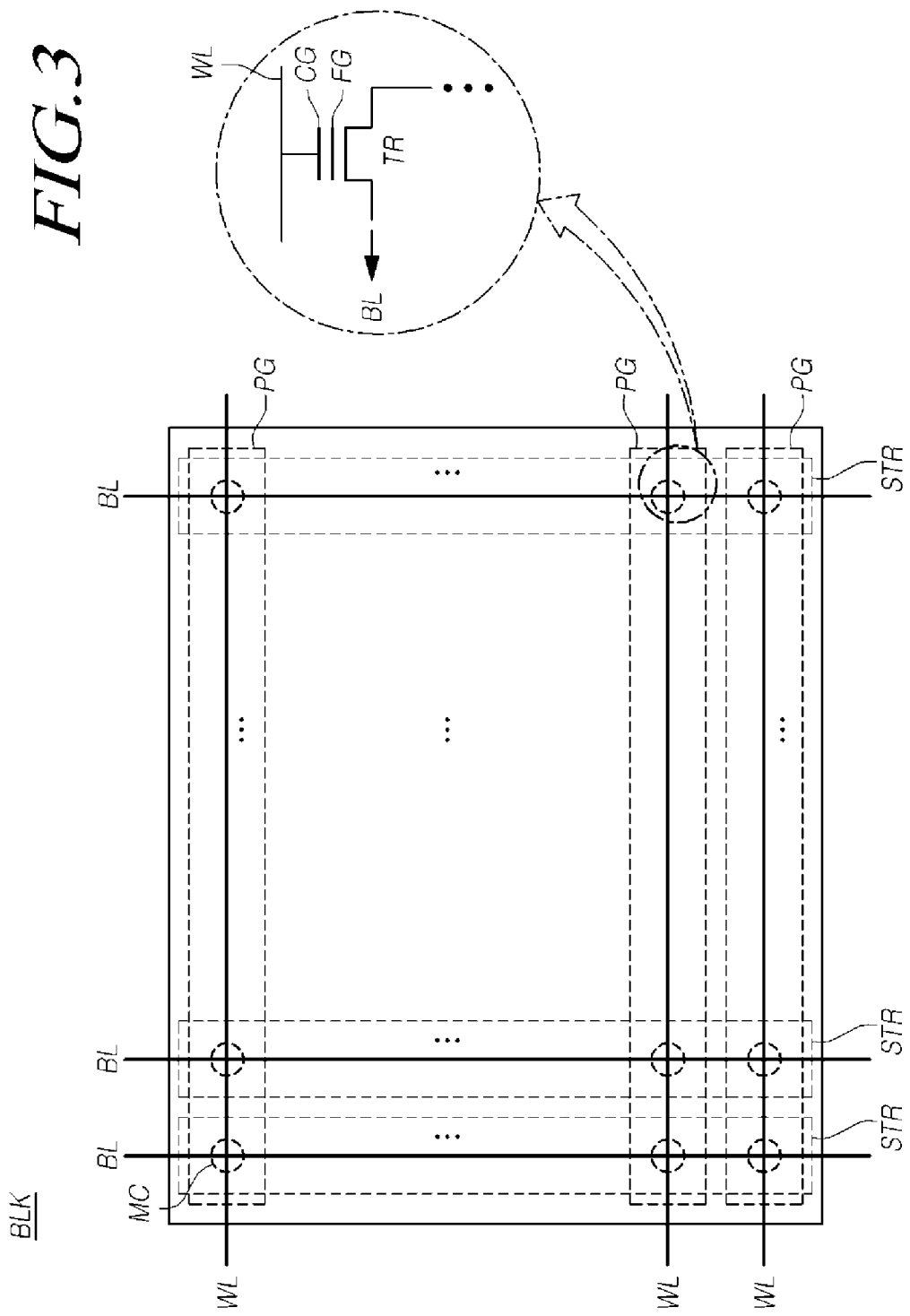
FIG. 3 is a schematic diagram illustrating a representative memory block of a memory device in accordance with an embodiment of the disclosure.

FIG. 3 is a schematic diagram illustrating a representative memory block BLK of the memory device 110 in accordance with an embodiment of the disclosure.

Referring to FIG. 3, the memory block BLK in the memory device 110 may be configured, for example, as a plurality of pages PG and a plurality of strings STR respectively disposed in different directions to form an intersecting pattern.

The plurality of pages PG correspond to a plurality of word lines WL, and the plurality of strings STR correspond to a plurality of bit lines BL.

In the memory block BLK, the plurality of word lines WL and the plurality of bit lines BL may be disposed to intersect with each other. For example, each of the plurality of word lines WL may be disposed in a row direction, and each of the plurality of bit lines BL may be disposed in a column direction. For another example, each of the plurality of word lines WL may be disposed in a column direction, and each of the plurality of bit lines BL may be disposed in a row direction.

As the plurality of word lines WL and the plurality of bit lines BL intersect with each other, a plurality of memory cells MC may be defined at such intersections. A transistor TR may be disposed in each memory cell MC.

For example, the transistor TR disposed in each memory cell MC may include a drain, a source and a gate. The drain (or source) of the transistor TR may be coupled with a corresponding bit line BL directly or via another transistor TR. The source (or drain) of the transistor TR may be coupled with a source line (which may be the ground) directly or via another transistor TR. The gate of the transistor TR may include a floating gate FG which is surrounded by a dielectric and a control gate CG to which a gate voltage is applied from a word line WL.

In each of the plurality of memory blocks BLK1 to BLKz, a first select line (also referred to as a source select line or a drain select line) may be additionally disposed outside a first outermost word line more adjacent to the read and write circuit 230, and a second select line (also referred to as a drain select line or a source select line) may be additionally disposed outside a second outermost word line.

As the case may be, at least one dummy word line may be additionally disposed between the first outermost word line and the first select line. At least one dummy word line may also be additionally disposed between the second outermost word line and the second select line.

When the memory device 110 has a memory block structure illustrated in FIG. 3, a read operation and a program operation (write operation) may be performed in the unit of page, and an erase operation may be performed in the unit of memory block.

Figure 4:
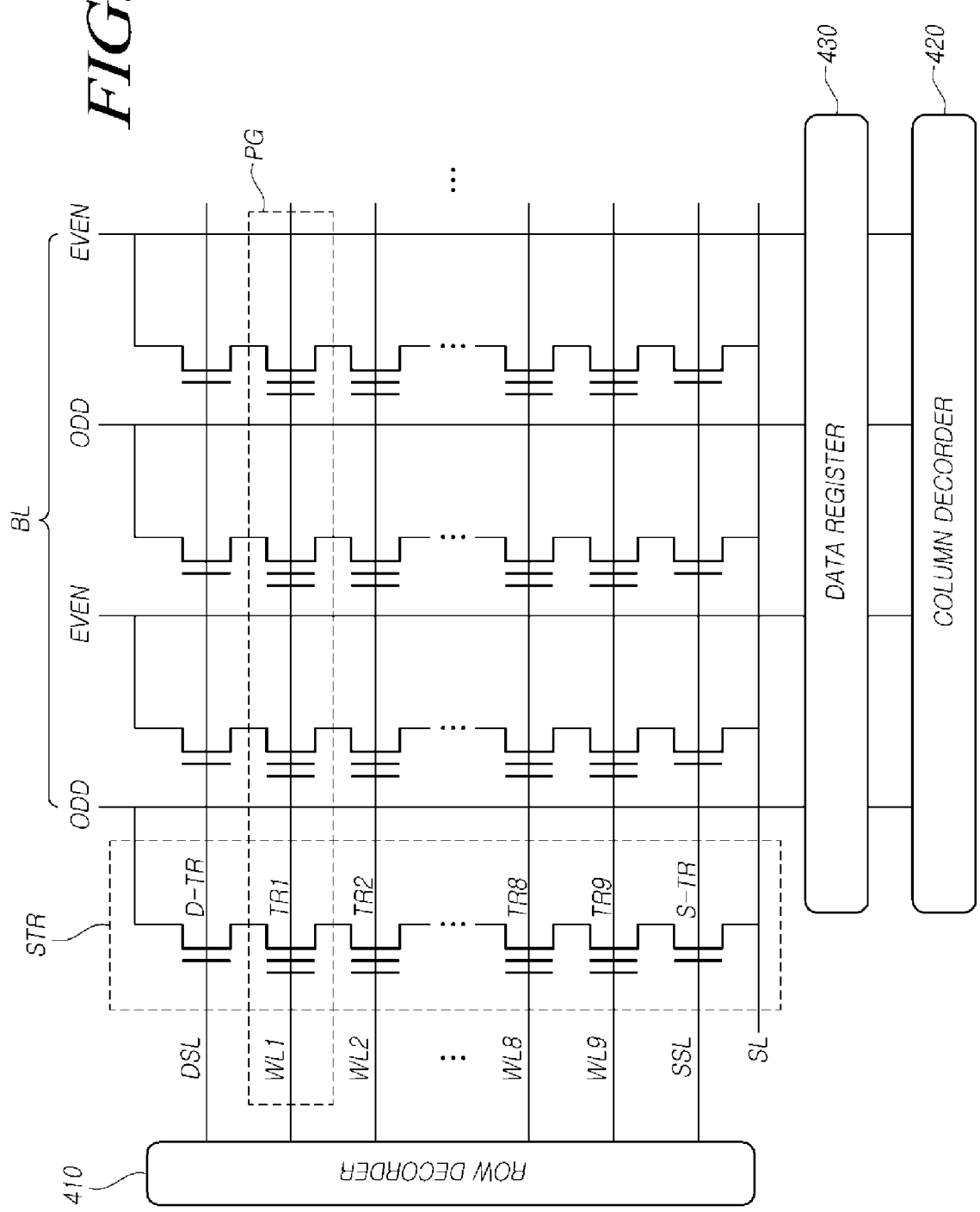
FIG. 4 is a schematic diagram illustrating word lines and bit lines of a memory device in accordance with an embodiment of the disclosure.

FIG. 4 is a diagram illustrating a structure of word lines WL and bit lines BL of the memory device 110 in accordance with an embodiment of the disclosure.

Referring to FIG. 4, in the memory device 110, there exist a core area in which memory cells MC are gathered and an auxiliary area which corresponds to the remaining area, i.e., the area excluding the core area and supports the operation of the memory cell array 210.

The core area may be configured by pages PG and strings STR. In such a core area, a plurality of word lines WL1 to WL9 and a plurality of bit lines BL are disposed to intersect with each other.

The plurality of word lines WL1 to WL9 may be coupled with a row decoder 410, and the plurality of bit lines BL may be coupled with a column decoder 420. A data register 430 corresponding to the read and write circuit 230 may be disposed between the plurality of bit lines BL and the column decoder 420.

The plurality of word lines WL1 to WL9 correspond to a plurality of pages PG.

For example, as illustrated in FIG. 4, each of the plurality of word lines WL1 to WL9 may correspond to one page PG. Alternatively, in the case in which the size of each of the plurality of word lines WL1 to WL9 is large, each of the plurality of word lines WL1 to WL9 may correspond to at least two (for example, two or four) pages PG. Page PG is a minimum unit in performing a program operation and a read operation. In the program operation and the read operation, all memory cells MC in the same page PG may simultaneously perform the corresponding operations.

The plurality of bit lines BL may be coupled with the column decoder 420 while being identified as odd-numbered bit lines BL and even-numbered bit lines BL.

In order to access memory cells MC, first, an address may be entered into the core area through the row decoder 410 and the column decoder 420 via an input/output terminal, and may designate target memory cells. Designating target memory cells means accessing memory cells MC positioned at sites where the word lines WL1 to WL9 coupled with the row decoder 410 and the bit lines BL coupled with the column decoder 420 intersect with each other, to program data to the memory cells MC or read out programmed data from the memory cells MC.

A page PG in a first direction (e.g., horizontal direction from the perspective of FIG. 4) is bound (coupled) by a common line which is referred to as a word line WL, and a string STR in a second direction (e.g., a vertical direction from the perspective of FIG. 4) is bound (coupled) by a common line which is referred to as a bit line BL. Being bound in common means that corresponding memory cells MC are structurally coupled with one another by the same material and the same voltage is simultaneously applied to the memory cells MC when a voltage is applied thereto. Of course, as a memory cell MC which is coupled in series and is positioned at an intermediate position or a last position is influenced by a voltage drop in a preceding memory cell MC, voltages applied to a first memory cell MC and a last memory cell MC may be slightly different from each other.

Since data is programmed and read via the data register 430 in all data processing operations of the memory device 110, the data register 430 plays a key role. If data processing of the data register 430 is delayed, all the other areas need to wait until the data register 430 completes the data processing. Also, if the performance of the data register 430 is degraded, the overall performance of the memory device 110 may be degraded.

Referring to the illustration of FIG. 4, in one string STR, a plurality of transistors TR1 to TR9 which are coupled with the plurality of word lines WL1 to WL9 may exist. Areas where the plurality of transistors TR1 to TR9 exist correspond to memory cells MC. Each of the plurality of transistors TR1 to TR9 includes a control gate CG and a floating gate FG as described above.

The plurality of word lines WL1 to WL9 include two outermost word lines WL1 and WL9. A first select line DSL may be additionally disposed outside a first outermost word line WL1 which is more adjacent to the data register 430 in terms of signal path, and a second select line SSL may be additionally disposed outside a second outermost word line WL9.

A first select transistor D-TR which is on-off controlled by the first select line DSL has only a gate electrode coupled with the first select line DSL and does not include a floating gate FG. A second select transistor S-TR which is on-off controlled by the second select line SSL has only a gate electrode coupled with the second select line SSL and does not include a floating gate FG.

The first select transistor D-TR serves as a switch which turns on or off the coupling between a corresponding string STR and the data register 430. The second select transistor S-TR serves as a switch which turns on or off the coupling between the corresponding string STR and a source line SL. That is to say, the first select transistor D-TR and the second select transistor S-TR are positioned at both ends of the corresponding string STR, and serve as gatekeepers which couple and decouple signals.

In a program operation, because it is necessary to fill electrons in a target memory cell MC of a bit line BL which is to be programmed, the memory system 100 turns on the first select transistor D-TR by applying a set turn-on voltage Vcc to the gate electrode of the first select transistor D-TR, and turns off the second select transistor S-TR by applying a set turn-off voltage (e.g., 0V) to the gate electrode of the second select transistor S-TR.

In a read operation or a verify operation, the memory system 100 turns on both the first select transistor D-TR and the second select transistor S-TR. Accordingly, since current may be discharged to the source line SL corresponding to the ground through the corresponding string STR, a voltage level of the bit line BL may be measured. However, in the read operation, there may be a time difference between on-off timings of the first select transistor D-TR and the second select transistor S-TR.

In an erase operation, the memory system 100 may supply a set voltage (e.g., +20V) to a substrate through the source line SL. In the erase operation, the memory system 100 floats both the first select transistor D-TR and the second select transistor S-TR, thereby providing infinite resistance. Accordingly, the memory system 100 is structured such that the first select transistor D-TR and the second select transistor S-TR do not function and electrons may operate due to a potential difference only between a floating gate FG and the substrate.

Figure 5:
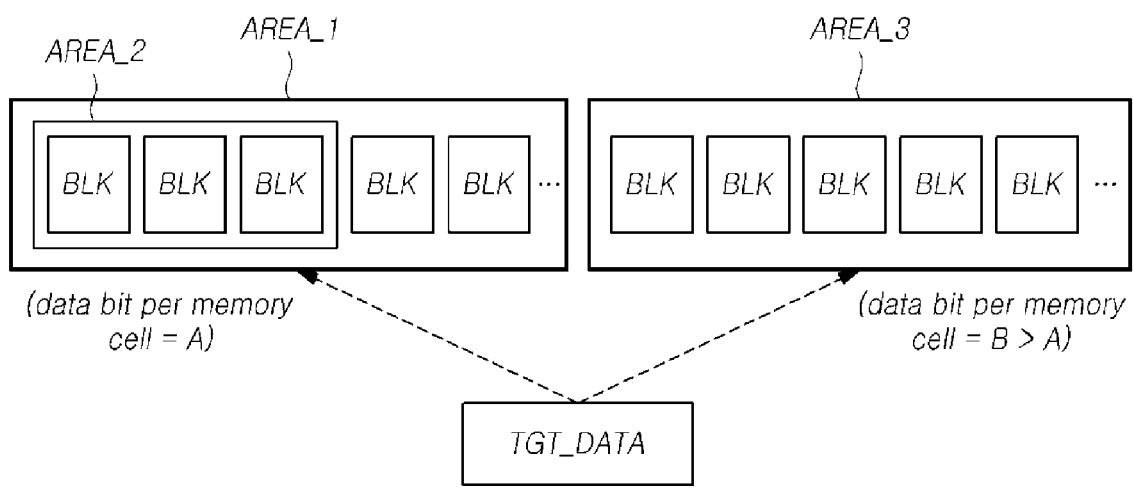
FIG. 5 is a schematic diagram illustrating an operation of a memory system in accordance with an embodiment of the disclosure.

FIG. 5 is a schematic diagram illustrating an operation of the memory system 100 in accordance with an embodiment of the disclosure.

Referring to FIG. 5, the memory controller 120 of the memory system 100 may set a first area AREA_1 which includes some of the plurality of memory blocks in the memory device 110, a second area AREA_2 within the first area AREA_1, and a third area AREA_3 external to the first area and which includes some of the plurality of memory blocks in the memory device 110.

The first area AREA_1 includes the second area AREA_2 and an area which does not overlap with the second area AREA_2. On the other hand, the third area AREA_3 does not overlap with the first area AREA_1.

The sizes of the first area AREA_1 and the third area AREA_3 may be changed. In contrast, the size of the second area AREA_2 may be fixed. However, the physical position of each memory block in the second area AREA_2 may be changed.

In embodiments of the disclosure, the number of data bits stored per memory cell of each memory block in the first area AREA_1 (denoted by A) is less than the number of data bits stored per memory cell of each memory block in the third area AREA_3 (denoted by B).

For example, if A is 1 (corresponding to single level cells (SLCs) in the memory blocks of AREA_1), B may be 2 or greater (corresponding to multi-level cells (MLCs), triple level cell (TLCs), or higher level cells in the memory blocks of AREA_3).

As another example, if A is 2 (corresponding to MLCs in the memory blocks of AREA_1), B may be 3 or greater (corresponding to TLCs, QLCs, or higher level cells in the memory blocks of AREA_3).

In this case, a speed at which data is written to the first area AREA_1 is faster than a speed at which data is written to the third area AREA_3.

On the other hand, since the number of data bits stored per memory cell in the memory blocks of AREA_3, the data storage capacity of each memory block in AREA_3 is larger than the data storage capacity of each memory block in AREA_1.

The memory controller 120 may determine whether target data TGT_DATA is to be written to the first area AREA_1 or the third area AREA_3.

The target data TGT_DATA means data requested, through a command from the host, to be written to the memory device 110 of the memory system 100.

The memory controller 120 may determine whether the target data TGT_DATA is to be written to AREA_1 or AREA_3 by considering various conditions.

A concrete operation in which the memory controller 120 determines an area to which the target data TGT_DATA is to be written is described below in detail with reference to FIGS. 10 and 11.

Since the first area AREA_1 includes the second area AREA_2, when the memory controller 120 writes (stores) the target data TGT_DATA to (in) the first area AREA_1, the target data TGT_DATA may, in some cases, be written to the second area AREA_2.

An operation in which the memory controller 120 writes the target data TGT_DATA to the first area AREA_1 is concretely described below with reference to FIGS. 6 to 8.

Figure 6:
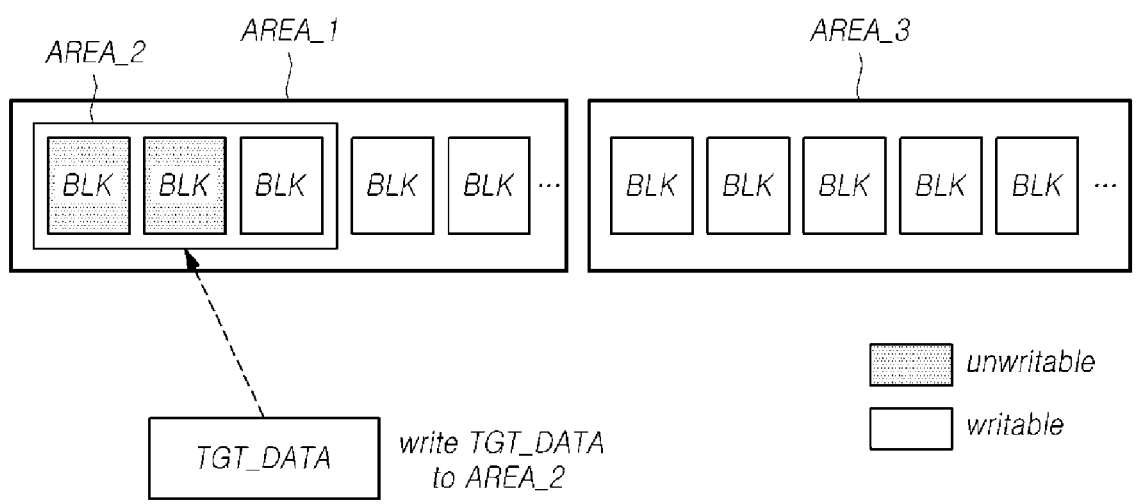
FIG. 6 is a schematic diagram illustrating an operation for a memory system to write target data to a first area, in accordance with an embodiment of the disclosure.

FIG. 6 is a diagram illustrating an operation for the memory system 100 to write the target data TGT_DATA to the first area AREA_1, in accordance with an embodiment of the disclosure.

Referring to FIG. 6, among three memory blocks BLK in the second area AREA_2, two are unwritable and one is writable. On the other hand, all memory blocks BLK in the portion of the first area AREA_1 that does not include the second area AREA_2 are writable.

The memory controller 120 may write the target data TGT_DATA to the writable memory block in the second area AREA_2.

Figure 7:
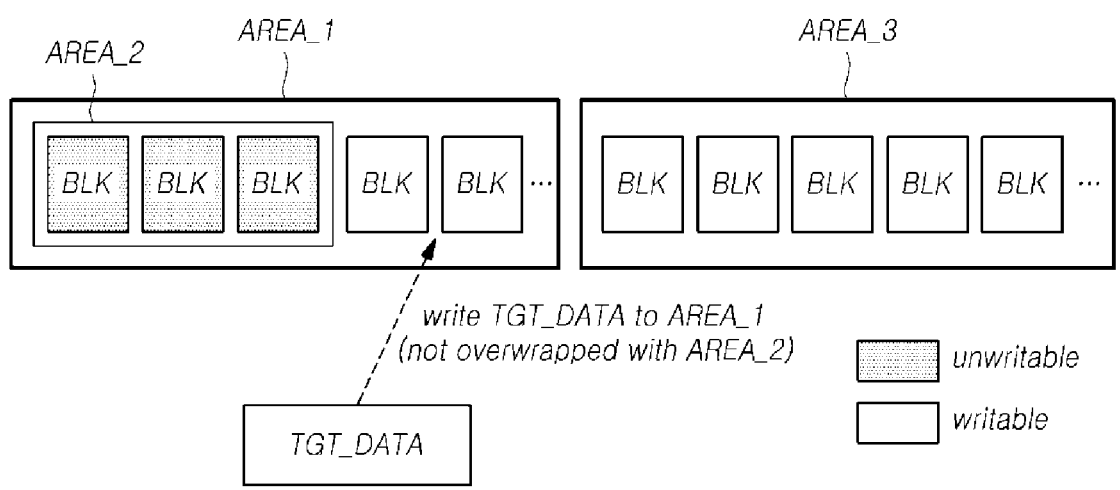
FIG. 7 is a schematic diagram illustrating an operation for a memory system to write target data to a first area, in accordance with an embodiment of the disclosure.

FIG. 7 is a diagram illustrating another operation for the memory system 100 to write the target data TGT_DATA to the first area AREA_1, in accordance with an embodiment of the disclosure.

Referring to FIG. 7, all three memory blocks BLK in the second area AREA_2 are unwritable. On the other hand, all memory blocks BLK in the portion of the first area AREA_1 that does not include the second area AREA_2 are writable.

The memory controller 120 may write the target data TGT_DATA to the writable memory blocks in the first area AREA_1.

Summarizing the content described above with reference to FIGS. 6 and 7, when the target data TGT_DATA is written to the first area AREA_1, the memory controller 120 may write the target data TGT_DATA preferentially to the second area AREA_2 in the first area AREA_1. That is to say, the memory controller 120 first attempts to write the target data TGT_DATA to the second area AREA_2, but when there are no writable memory blocks in the second area AREA_2, attempts to write the target data TGT_DATA to in the portion of the first area AREA_1 that does not overlap with the second area AREA_2.

Figure 8:
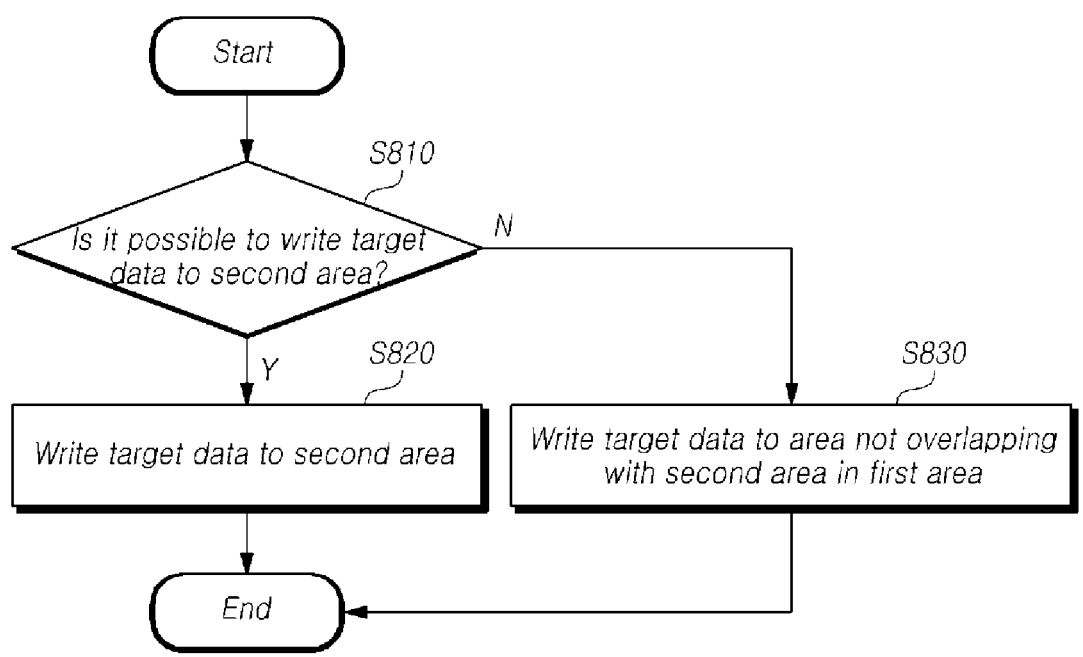
FIG. 8 is a flow chart illustrating an operation for a memory system to write target data to a first area, in accordance with an embodiment of the disclosure.

FIG. 8 is a flow chart illustrating an operation for the memory system 100 to write the target data TGT_DATA to the first area AREA_1, in accordance with an embodiment of the disclosure.

Referring to FIG. 8, when writing the target data TGT_DATA to the first area AREA_1, the memory controller 120 of the memory system 100 determines whether it is possible to write the target data TGT_DATA to the second area AREA_2 in the first area AREA_1 (S810).

In this regard, for example, when there is at least one free memory block among memory blocks in the second area AREA_2, the memory controller 120 may determine that it is possible to write the target data TGT_DATA to the second area AREA_2.

As another example, when the total size of free memory blocks among memory blocks in the second area AREA_2 is equal to or larger than the size of the target data TGT_DATA, the memory controller 120 may determine that it is possible to write the target data TGT_DATA to the second area AREA_2.

If it is possible for the memory controller 120 to write the target data TGT_DATA to the second area AREA_2 (S810—Y), the memory controller 120 may write the target data TGT_DATA to the second area AREA_2 (S820).

On the other hand, if it is not possible for the memory controller 120 to write the target data TGT_DATA to the second area AREA_2 (S810—N), the memory controller 120 may write the target data TGT_DATA to the portion of the first area AREA_1 that does not overlap with the second area AREA_2 (S830).

Figure 9:
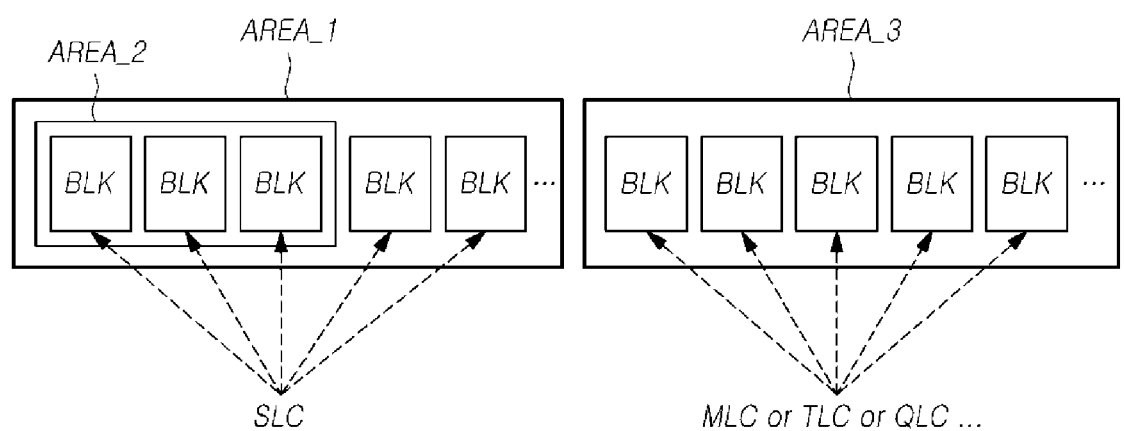
FIG. 9 is a schematic diagram illustrating a specific characteristic of memory blocks in a first area or a third area in a memory system in accordance with an embodiment of the disclosure.

FIG. 9 is a diagram illustrating a specific characteristic of memory blocks in the first area AREA_1 or the third area AREA_3 in the memory system 100 in accordance with an embodiment of the disclosure.

Referring to FIG. 9, each of the memory blocks in the first area AREA_1 may be a single level cell (SLC) memory block. In other words, each memory cell in each of the memory blocks in the first area AREA_1 may be a single level cell (SLC) which stores 1 bit of data.

Further, each memory cell in each of memory blocks included in the third area AREA_3 may be a memory cell which stores 2 or more bits of data (e.g., a multi-level cell (MLC), a triple level cell (TLC) or a quad level cell (QLC)).

With this configuration, a speed at which data is written to the first area AREA_1 is faster than a speed at which data is written to the third area AREA_3.

On the other hand, since each memory block in the third area AREA_3 may store 2 or more bits of data per memory cell, the data storage capacity of each memory block in the third area AREA_3 is larger than the data storage capacity of each memory block in the first area AREA_1.

Figure 10:
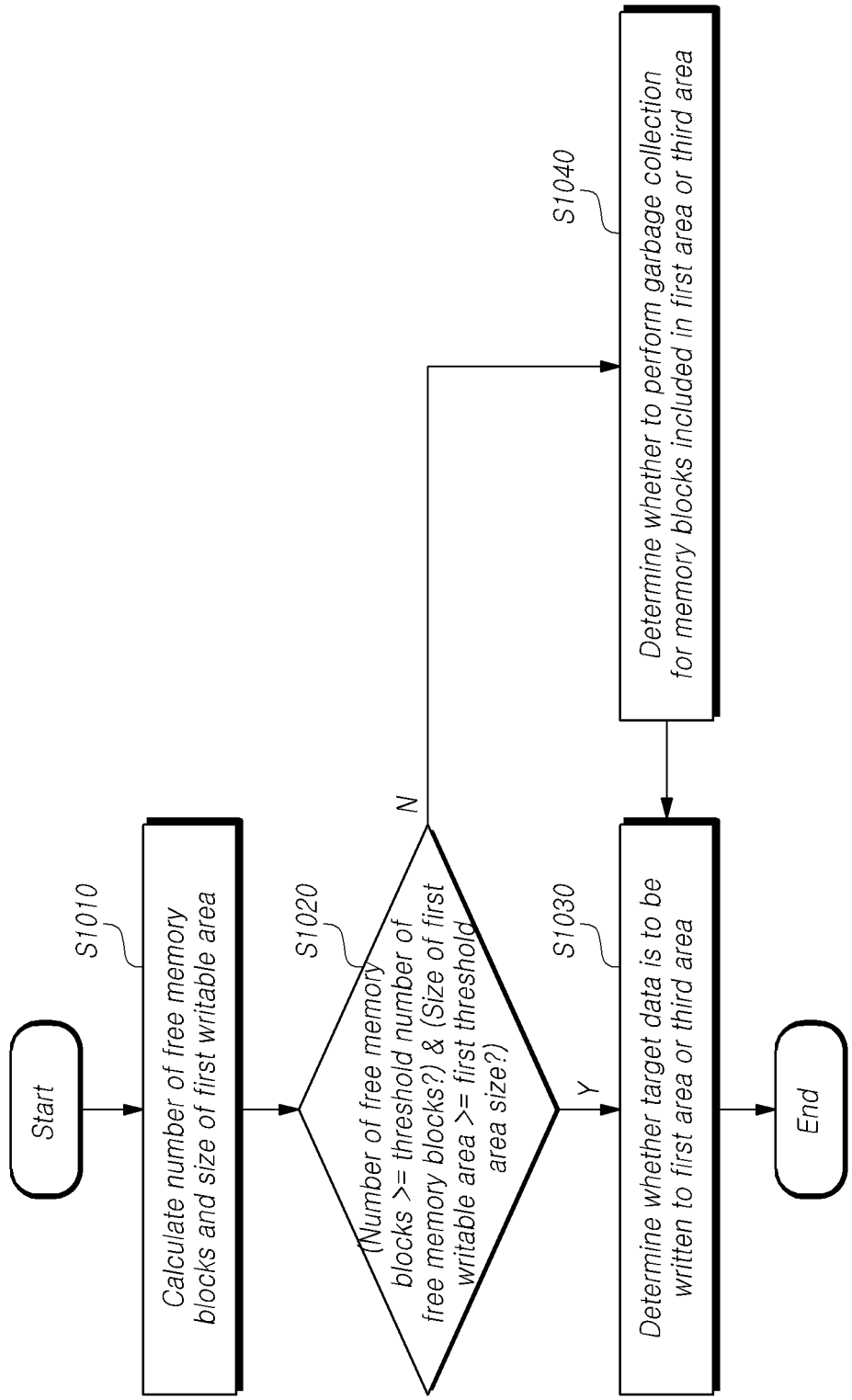
FIG. 10 is a flow chart illustrating an operation for a memory system to determine an area to which target data is to be written, in accordance with an embodiment of the disclosure.

FIG. 10 is a flow chart illustrating an operation for the memory system 100 to determine an area to which the target data TGT_DATA is to be written, in accordance with an embodiment of the disclosure.

Referring to FIG. 10, first, the memory controller 120 of the memory system 100 may calculate the number of free memory blocks among the memory blocks in the first area AREA_1 or the third area AREA_3 and the size of a writable area in the first area AREA_1 (S1010). The size of the writable area in AREA_1 may be referred to as a first writable area.

The memory controller 120 may determine whether the number of free memory blocks calculated at the step S1010 is equal to or greater than a threshold number of free memory blocks (e.g., 10) and whether the size of the first writable area calculated at the step S1010 is equal to or larger than a first threshold area size (e.g., 1 MB) (S1020).

If the number of free memory blocks is equal to or greater than the threshold number of free memory blocks and the size of the first writable area is equal to or larger than the first threshold area size (S1020—Y), the memory controller 120 may determine whether the target data TGT_DATA is to be written to the first area AREA_1 or the third area AREA_3 (S1030).

In detail, the memory controller 120 may determine whether the target data TGT_DATA is to be written to the first area AREA_1 or the third area AREA_3, based on at least one of i) a valid data percentage indicating the percentage of an area in which valid data is stored in each of the first area AREA_1 and the third area AREA_3 and ii) the size of a writable area in the second area AREA_2 (second writable area).

When no problem would be caused in the memory system 100 by storing the target data TGT_DATA in the first area AREA_1, the memory controller 120 may cause the target data TGT_DATA to be stored in the first area AREA_1 whose data write speed is fast, to secure the data write performance level of the memory system 100 at a set reference level.

A concrete method for the memory controller 120 to determine at step S1030 to which area the target data TGT_DATA is to be written is described below in detail with reference to FIG. 11.

Continuing with FIG. 10, if the number of free memory blocks is less than the threshold number of free memory blocks or the size of the first writable area is smaller than the first threshold area size (S1020—N), the memory controller 120 may determine whether to perform garbage collection for the memory blocks in the first area AREA_1 or the third area AREA_3 (S1040), and then, may determine whether the target data TGT_DATA is to be written to the first area AREA_1 or the third area AREA_3 (S1030).

If the number of free memory blocks is less than the threshold number of free memory blocks or the size of the first writable area is smaller than the first threshold area size, the memory controller 120 may determine, after storing the target data TGT_DATA to the first area AREA_1 or the third area AREA_3 in the memory device 110 without performing garbage collection, that the data write performance of the memory system 100 is degraded because the number of free memory blocks is insufficient or data can no longer be stored in the first area AREA_1.

Therefore, in this case, the memory controller 120 may additionally secure free memory blocks by performing garbage collection for the memory blocks in the first area AREA_1 or the third area AREA_3. If free memory blocks are additionally generated in the first area AREA_1 after performing the garbage collection and thus the size of the first writable area becomes equal to or larger than the first threshold area size, the memory controller 120 may write the target data TGT_DATA to the first area AREA_1. Hence, in this case, the memory controller 120 may first determine whether to perform garbage collection.

A concrete method for the memory controller 120 to determine whether to perform garbage collection is described below with reference to FIG. 12.

Figure 11:
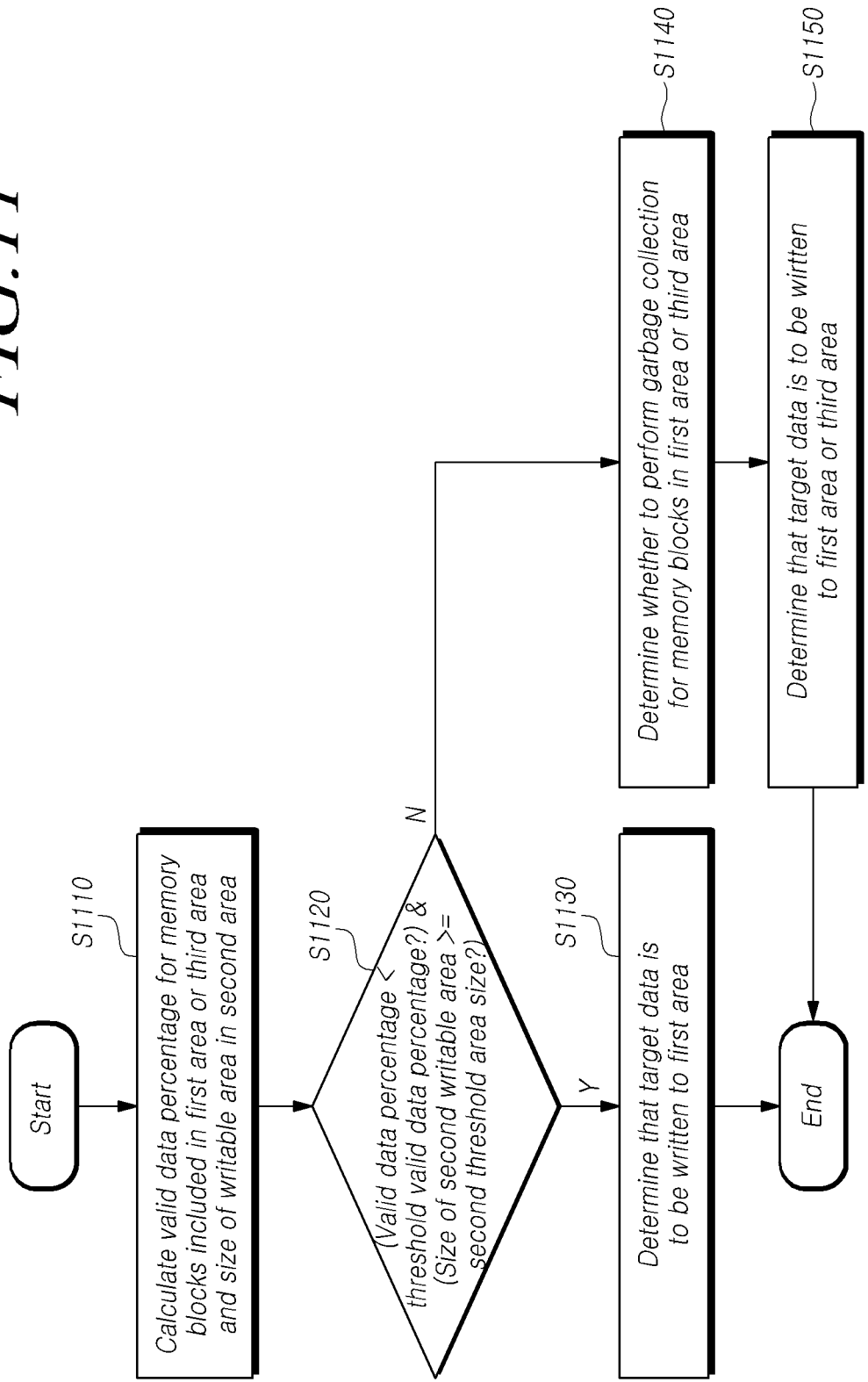
FIG. 11 is a flow chart illustrating an operation for a memory system to determine an area to which target data is to be written, in accordance with an embodiment of the disclosure.

FIG. 11 is a flow chart illustrating an operation for the memory system 100 to determine an area to which the target data TGT_DATA is to be written, according to an embodiment of the disclosure.

Referring to FIG. 11, the memory controller 120 of the memory system 100 may calculate i) a valid data percentage indicating the percentage of an area in which valid data is stored in each of the first area AREA_1 and the third area AREA_3, and ii) the size of a writable area in the second area AREA_2 (second writable area) (S1110).

The valid data percentage means the percentage of an area in which valid data, that is, data to be requested by the host, is stored in each of the first area AREA_1 and the third area AREA_3.

For example, it is assumed that three memory blocks each having a size of 1 MB are included in the first area AREA_1 and five memory blocks each having a size of 1 MB are included in the third area AREA_3. Further, it is assumed that each memory block includes 256 pages each having a size of 4 KB.

In addition, it is assumed that 192 pages in each of which valid data is stored exist in one of the memory blocks included in the first area AREA_1 and 128 pages in each of which valid data is stored exist in another one of the memory blocks included in the first area AREA_1.

Moreover, it is assumed that 64 pages, each storing valid data, exist in each of three of the memory blocks in the third area AREA_3 and that neither of the remaining two memory blocks in the third area AREA_3 have any pages storing valid data.

In this case, a valid page percentage is determined as (2 MB/8 MB)=25% based on the sum 8 MB of the sizes of the first area AREA_1 and the third area AREA_3 and the sum 2 MB (4 KB*(192+128+64*3)) of the sizes of the pages storing valid data.

The memory controller 120 may determine whether the valid data percentage calculated at step S1110 is less than a threshold valid data percentage (e.g., 80%) or the size of the second writable area calculated at step S1110 is equal to or larger than a second threshold area size (e.g., 512 KB) (S1120).

If the valid data percentage is less than the threshold valid data percentage or the size of the second writable area is equal to or larger than the second threshold area size (S1120—Y), the memory controller 120 may determine that the target data TGT_DATA is to be written to the first area AREA_1 (S1130).

If the valid data percentage is less than the threshold valid data percentage, this means that an area to which the target data TGT_DATA may be written is sufficient. Therefore, the memory controller 120 may determine that the target data TGT_DATA is to be written to the first area AREA_1.

Even in the case where the valid data percentage is equal to or greater than the threshold valid data percentage, if the size of the second writable area is equal to or larger than the second threshold area size, this means that the target data TGT_DATA may be stored in the second area AREA_2 in the first area AREA_1. Therefore, the memory controller 120 may determine that the target data TGT_DATA is to be written to the first area AREA_1.

On the other hand, if the valid data percentage is equal to or greater than the threshold valid data percentage and the size of the second writable area is smaller than the second threshold area size (S1120—N), the memory controller 120 may determine whether to perform garbage collection for the memory blocks in the first area AREA_1 or the third area AREA_3 (S1140), and then, may determine that the target data TGT_DATA is to be written to the first area AREA_1 or the third area AREA_3 (S1150).

For example, at step S1150, when the total sum of the sizes of free memory blocks among the memory blocks in the first area AREA_1 is equal to or larger than the size of the target data TGT_DATA, the memory controller 120 may determine that the target data TGT_DATA is to be written to the first area AREA_1.

Conversely, when the total sum of the sizes of free memory blocks among the memory blocks included in the first area AREA_1 is smaller than the size of the target data TGT_DATA, the memory controller 120 may determine that the target data TGT_DATA is to be written to the third area AREA_3.

The size of the second writable area described above with reference to FIG. 11 may be managed in various ways.

For example, the memory controller 120 may generate a count value which indicates the size of the second writable area, and may increase that count value when the size of the second writable area increases and decrease that count value when the size of the second writable area decreases.

Figure 12:
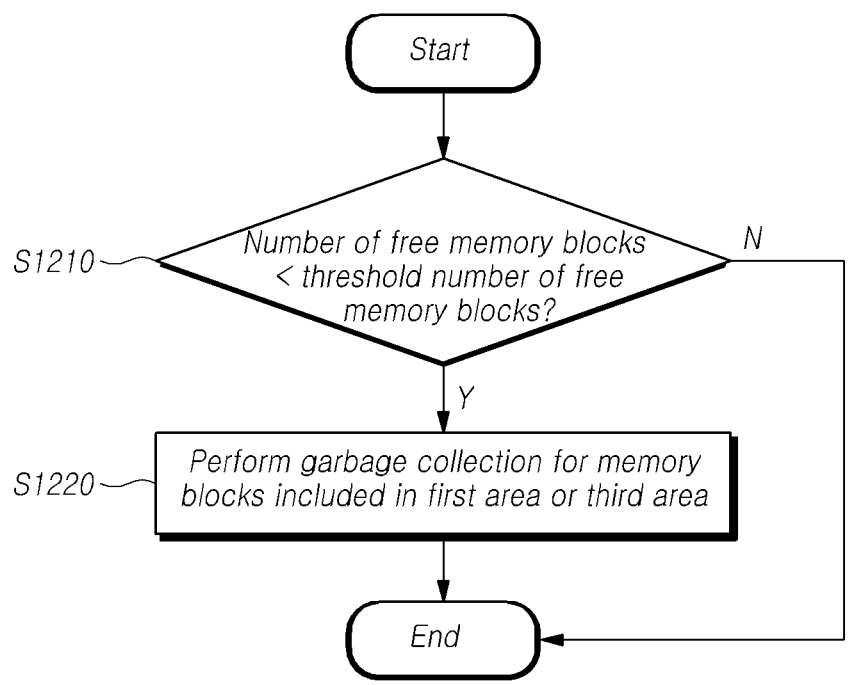
FIG. 12 is a flow chart illustrating an operation for a memory system to determine whether to perform garbage collection, in accordance with an embodiment of the disclosure.

FIG. 12 is a flow chart illustrating an operation for the memory system 100 to determine whether to perform garbage collection, in accordance with an embodiment of the disclosure.

Referring to FIG. 12, the memory controller 120 of the memory system 100 determines whether the number of free memory blocks among the memory blocks in the first area AREA_1 or the third area AREA_3 is less than the threshold number of free memory blocks (S1210).

If the number of free memory blocks is less than the threshold number of free memory blocks (S1210—Y), the memory controller 120 performs garbage collection for the memory blocks included in the first area AREA_1 or the third area AREA_3.

Figure 13:
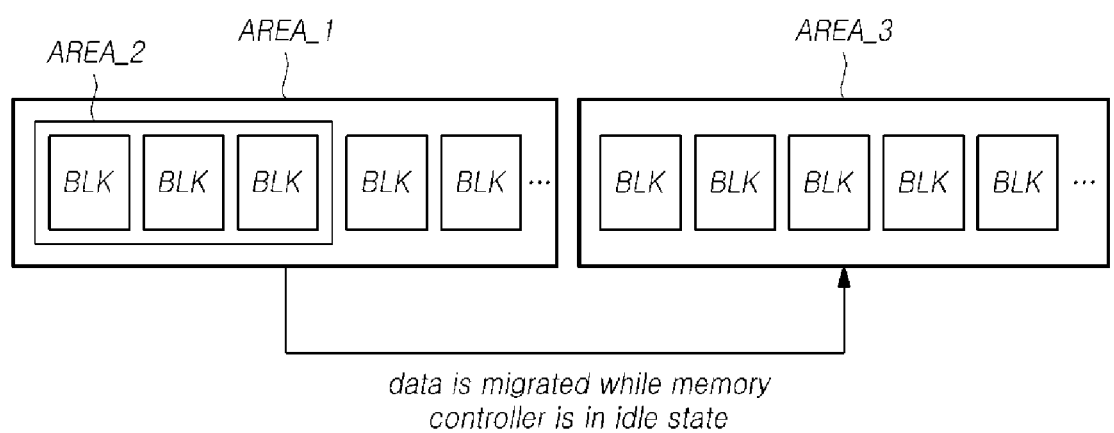
FIG. 13 is a schematic diagram illustrating an operation for a memory system to migrate data stored in a first area to a third area, in accordance with an embodiment of the disclosure.

FIG. 13 is a diagram illustrating an operation for the memory system 100 to migrate data stored in the first area AREA_1 to the third area AREA_3, in accordance with an embodiment of the disclosure.

Referring to FIG. 13, when the memory controller 120 is in an idle state, the memory controller 120 of the memory system 100 may migrate data stored in the first area AREA_1 to the third area AREA_3.

By migrating the data from the first area AREA_1 to the third area AREA_3, the memory controller 120 may allow data to be written to the first area AREA_1 whose data write speed is fast. Further, by then migrating data initially stored in the first area AREA_1 to the third area AREA_3 whose storage capacity per memory block is large, the memory controller 120 may ensure that the storage capacity of the memory system 100 is maintained at or above a set reference capacity.

When the memory controller 120 is in an idle state, the memory controller 120 does not process any command (e.g., a read/write/erase command) received from the host.

As the memory controller 120 performs the migration only when it is in an idle state, it is possible to migrate the data stored in the first area AREA_1 to the third area AREA_3 while not causing performance degradation in the process of processing a command received from the host.

Figure 14:
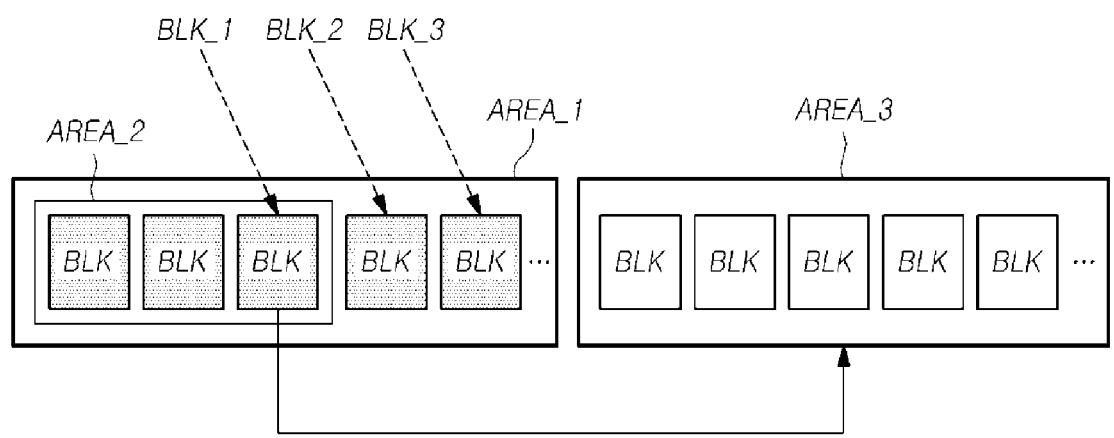
FIG. 14 is a schematic diagram illustrating migration priorities for data stored in a first area in a memory system in accordance with an embodiment of the disclosure.

FIG. 14 is a diagram illustrating migration priorities for data stored in the first area AREA_1 in the memory system 100 in accordance with an embodiment of the disclosure.

The memory controller 120 may preferentially migrate data stored in the second area AREA_2 to the portion of the first area AREA_1 that does not overlap with the second area AREA_2.

Referring to FIG. 14, among the memory blocks BLK in the first area AREA_1, a memory block BLK_1 is included in the second area AREA_2, and memory blocks BLK_2 and BLK_3 are included in the other portion of the first area AREA_1, that is, the portion that does not overlap with the second area AREA_2.

When in an idle state, the memory controller 120 may preferentially migrate data stored in the memory block BLK_1 to the memory blocks BLK_2 and BLK_3.

After all data stored in the second area AREA_2 are migrated to the third area AREA_3, the memory controller 120 may migrate the data stored in the memory blocks BLK_2 and BLK_3 to the third area AREA_3.

Figure 15:
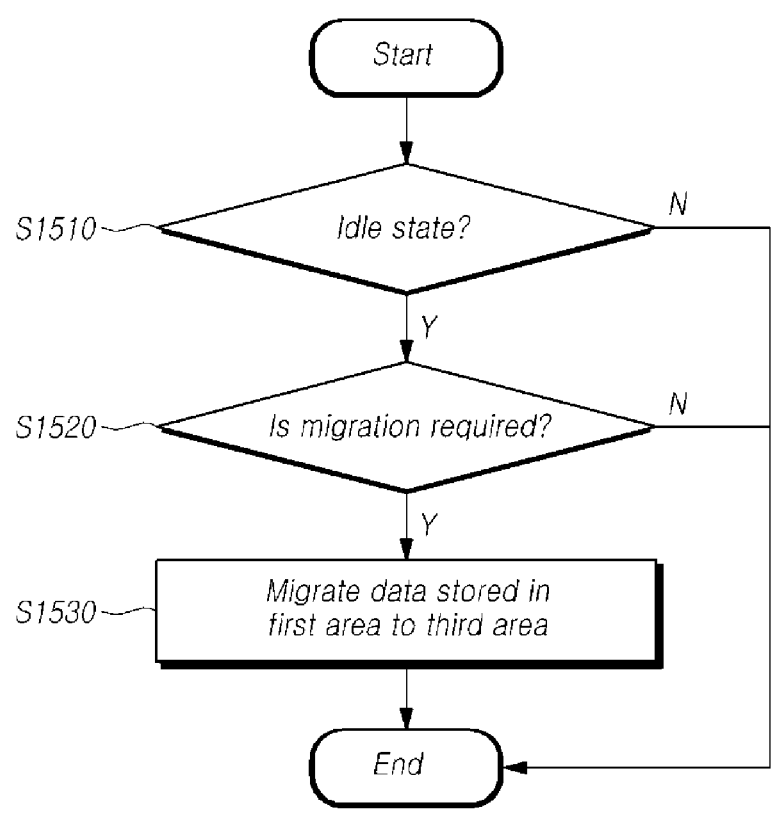
FIG. 15 is a flow chart illustrating a representation of an example of an operation for the memory system in accordance with the embodiments of the disclosure to migrate data stored in a first area to a third area.

FIG. 15 is a flow chart illustrating an operation for the memory system 100 to migrate data stored in the first area AREA_1 to the third area AREA_3, in accordance with an embodiment of the disclosure.

The memory controller 120 of the memory system 100 determines whether the memory controller 120 is in an idle state (S1510).

If the memory controller 120 is in an idle state (S1510—Y), the memory controller 120 determines whether it is necessary to migrate data stored in the first area AREA_1 to the third area AREA_3 (S1520).

For example, if the size of the data stored in the first area AREA_1 is equal to or larger than a threshold, the memory controller 120 may determine that it is necessary to migrate the data stored in the first area AREA_1 to the third area AREA_3, in order to secure more, and at least a minimum, space for writing data in the first area AREA_1.

When the memory controller 120 determines that it is necessary to migrate the data stored in the first area AREA_1 to the third area AREA_3 (S1520—Y), the memory controller 120 may migrate the data stored in the first area AREA_1 to the third area AREA_3 (S1530).

Figure 16:
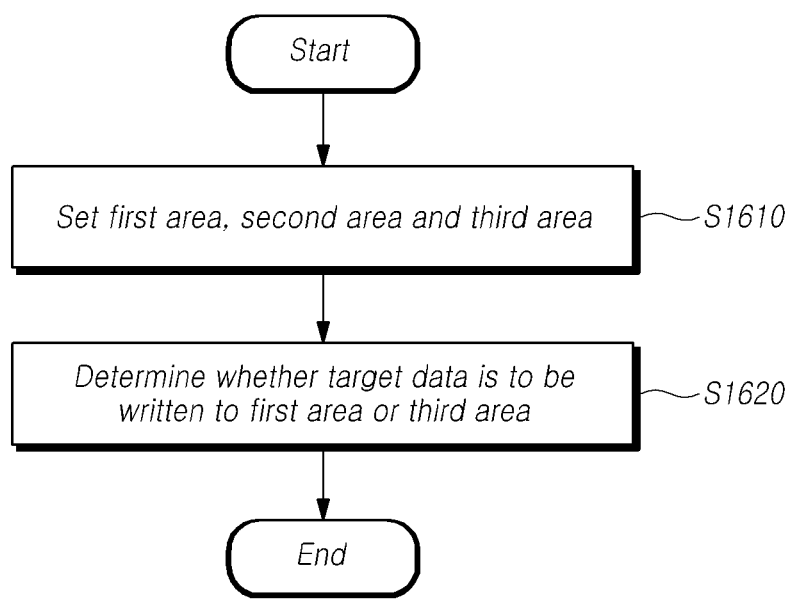
FIG. 16 is a flow chart to assist in the explanation of a method for operating a memory controller in accordance with an embodiment of the disclosure.

FIG. 16 is a flow chart to assist in the explanation of a method for operating the memory controller 120 in accordance with an embodiment of the disclosure.

First, the method for operating the memory controller 120 may include step S1610 of setting a first area that includes a first subset of the plurality of memory blocks in the memory device 110, a second area in the first area, and a third area including a second subset of the plurality of memory blocks.

The method for operating the memory controller 120 may include step S1620 of determining whether target data is to be written to the first area or the third area.

When the target data is written to the first area, the target data may be preferentially written to the portion of the first area that overlaps with the second area.

The number of data bits stored per memory cell of each memory block in the first area is less than the number of data bits stored per memory cell of each memory block in the third area.

The above-described operation of the memory controller 120 may be controlled by the control circuit 123, and may be performed in such a manner that the processor 124 executes (drives) firmware to which general operations of the memory controller 120 are programmed.

Figure 17:
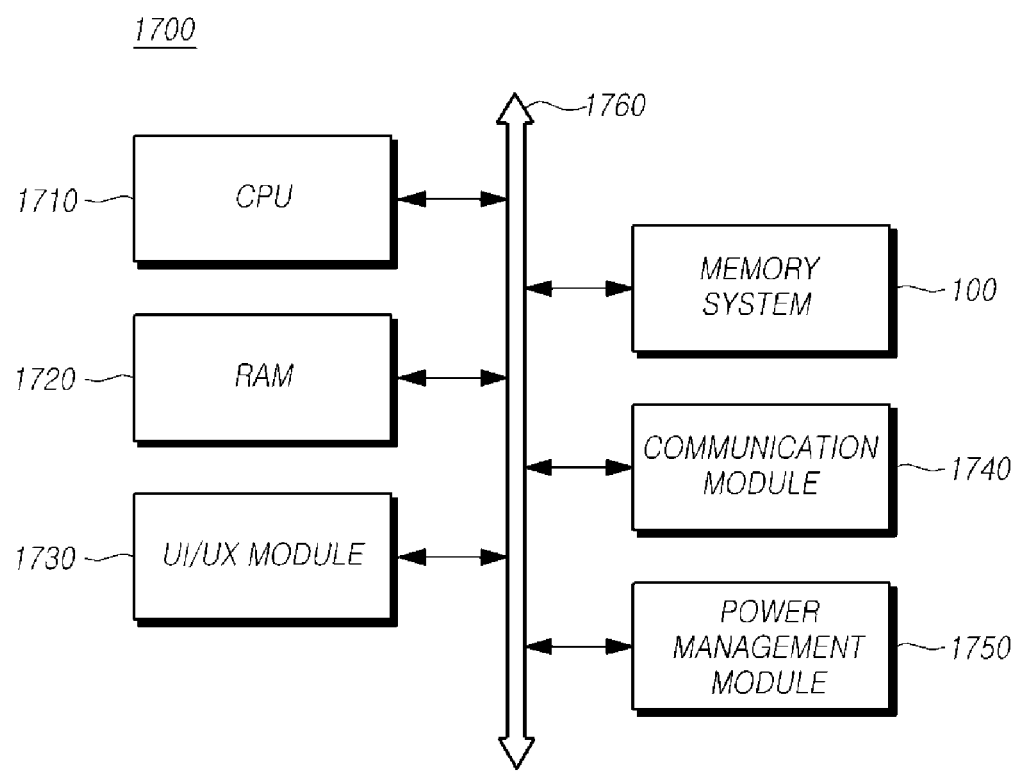
FIG. 17 is a schematic diagram illustrating a configuration of a computing system in accordance with an embodiment of the disclosure.

FIG. 17 is a schematic diagram illustrating a configuration of a computing system 1700 in accordance with an embodiment of the disclosure.

Referring to FIG. 17, the computing system 1700 may include a memory system 100, a central processing unit (CPU) 1710 for controlling general operations of the computing system 1700, a RAM 1720 for storing data and information related with operations of the computing system 1700, a UI/UX (user interface/user experience) module 1730 for providing a user environment, a communication module 1740 for communicating with an external device in a wired and/or wireless manner and a power management module 1750 for managing power used by the computing system 1700, which are electrically coupled to a system bus 1760.

The computing system 1700 may include a PC (personal computer), a mobile terminal such as a smartphone or a tablet, or any of various other electronic devices.

The computing system 1700 may further include a battery for supplying an operating voltage, and may further include an application chipset, a graphic-related module, a camera image processor (CIS), and a DRAM. As those skilled in the art can appreciate, the computing system 1700 may include other components.

The memory system 100 may be of various types including a type which stores data in a magnetic disk, such as a hard disk drive (HDD), and a type which stores data in a nonvolatile memory, such as a solid state drive (SDD), a universal flash storage (UFS) device or an embedded MMC (eMMC) device. The nonvolatile memory may include a ROM (read only memory), a PROM (programmable ROM), an EPROM (electrically programmable ROM), an EEPROM (electrically erasable and programmable ROM), a flash memory, a PRAM (phase-change RAM), an MRAM (magnetic RAM), an RRAM (resistive RAM), and/or an FRAM (ferroelectric RAM). In addition, the memory system 100 may be realized as any of various types of storage devices, and may be mounted in various electronic devices.

Although various embodiments of the disclosure have been illustrated and described, those skilled in the art will appreciate that various modifications, additions and substitutions are possible, without departing from the scope and spirit of the invention. Therefore, the disclosed embodiments are to be considered in a descriptive sense only, not for limiting the scope of the invention. The present invention encompasses all variations and modifications of any disclosed embodiment that fall within the scope of the claims including their equivalents.

What is claimed is:

1. A memory system comprising:
    a memory device including a plurality of memory blocks; and
    a memory controller configured to control the memory device,
    wherein the memory controller is further configured to set a first area which includes a first subset of the plurality of memory blocks, a second area within the first area, and a third area which includes a second subset of the plurality of memory blocks,
    wherein, in an operation to determine if target data is to be written to the first area, the memory controller is further configured to a) write the target data to the second area when there are writable memory blocks in the second area, and b) thereafter if there are no writable memory blocks in the second area during the operation to determine if the target data is to be written to the first area, write the target data to the portion of the first area that does not overlap with the second area where there are writable memory blocks in the portion of the first area that does not overlap with the second area,
    wherein the number of data bits stored per memory cell in the first area is less than the number of data bits stored per memory cell in the third area, and
    when there are writable memory blocks in the second area and when the number of free memory blocks in the first area or the third area is equal to or greater than a first threshold number of free memory blocks or a size of a first writable area in the first area is equal to or larger than a first threshold area size, the memory controller determines a) whether the target data is to be written to the first area and b) whether the target data is to be written to the third area,
    both determining whether the target data is to be written to the first area and determining whether the target data is to be written to the third area are based at least on a valid data percentage indicating a percentage of an area in which valid data to be requested by a host is stored in each of the first area and the third area and a size of a second writable area in the second area.

2. The memory system according to claim 1, wherein each memory cell in the first area is a single level cell (SLC) which stores 1 bit of data.

3. The memory system according to claim 2, wherein each memory cell in the third area stores 2 or more bits of data.

4. The memory system according to claim 1, wherein, when the number of free memory blocks in the first area or the third area is less than a threshold number of free memory blocks or a size of a first writable area in the first area is smaller than a first threshold area size, the memory controller is further configured to determine whether to perform garbage collection for the memory blocks in the first area or the third area, before determining whether the target data is to be written to the first area or the third area.

5. The memory system according to claim 1, wherein, when the valid data percentage is equal to or greater than a threshold valid data percentage and the size of the second writable area is smaller than a second threshold area size, the memory controller determines whether to perform garbage collection for the memory blocks in the first area or the third area, before determining whether the target data is to be written to the first area or the third area.

6. The memory system according to claim 1, wherein, when the valid data percentage is less than a threshold valid data percentage or the size of the second writable area is equal to or larger than a second threshold area size, the memory controller determines that the target data is to be written to the first area.

7. The memory system according to claim 1, wherein, when the memory controller is in an idle state, the memory controller is further configured to migrate data from the first area to the third area.

8. The memory system according to claim 7, wherein data stored in the second area is preferentially migrated to a portion of the first area not overlapping with the second area.

9. A memory controller comprising:
    a memory interface configured to communicate with a memory device including a plurality of memory blocks; and
    a control circuit configured to control the memory device,
    wherein the control circuit is further configured to set a first area which includes a first subset of the plurality of memory blocks, a second area within the first area, and a third area which includes a second subset of the plurality of memory blocks,
    wherein the control circuit is further configured to determine whether the target data is to be written to the first area or the third area,
    wherein, in an operation to determine if the target data is to be written to the first area, the control circuit is further configured to a) write the target data to the second area when there are writable memory blocks in the second area, and b) thereafter if there are no writable memory blocks in the second area during the operation to determine if the target data is to be written to the first area, write the target data to the portion of the first area that does not overlap with the second area where there are writable memory blocks in the portion of the first area that does not overlap with the second area,
    wherein
    the number of data bits stored per memory cell in the first area is less than the number of data bits stored per memory cell in the third area, and
    wherein, when there are writable memory blocks in the second area and when the number of free memory blocks in the first area or the third area is equal to or greater than a first threshold number of free memory blocks or a size of a first writable area in the first area is equal to or larger than a first threshold area size, the control circuit determines a) whether the target data is to be written to the first area and b) whether the target data is to be written to the third area, both determining whether the target data is to be written to the first area and determining whether the target data is to be written to the third area are based on at least one of i) a valid data percentage indicating a percentage of an area in which valid data to be requested by a host is stored in each of the first area and the third area and ii) a size of a second writable area in the second area.

10. The memory controller according to claim 9, wherein each memory cell in the first area is a single level cell (SLC) which stores 1 bit of data.

11. The memory controller according to claim 10, wherein each memory cell in the third area stores 2 or more bits of data.

12. The memory controller according to claim 9, wherein, when the number of free memory blocks in the first area or the third area is less than a threshold number of free memory blocks or a size of a first writable area in the first area is smaller than a first threshold area size, the control circuit determines whether to perform garbage collection for the memory blocks in the first area or the third area, before determining whether the target data is to be written to the first area or the third area.

13. The memory controller according to claim 9, wherein, when the valid data percentage is equal to or greater than a threshold valid data percentage and the size of the second writable area is smaller than a second threshold area size, the control circuit determines whether to perform garbage collection for the memory blocks in the first area or the third area, before determining whether the target data is to be written to the first area or the third area.

14. The memory controller according to claim 9, wherein, when the valid data percentage is less than a threshold valid data percentage or the size of the second writable area is equal to or larger than a second threshold area size, the control circuit determines that the target data is to be written to the first area.

15. The memory controller according to claim 9, wherein, when the memory controller is in an idle state, the control circuit is further configured to migrate data from the first area to the third area.

16. The memory controller according to claim 15, wherein data stored in the second area among data stored in the first area is preferentially migrated to a portion of the first area not overlapping with the second area.

17. A method for operating a memory controller which controls a memory device including a plurality of memory blocks, the method comprising:

setting a first area which includes a first subset of the plurality of memory blocks, a second area within the first area, and a third area which includes a second subset of the plurality of memory blocks; and determining whether target data is to be written to the first area or the third area, wherein, in an operation to determine if the target data is to be written to the first area, the target data is a) written to the second area when there are writable memory blocks in the second area, and b) thereafter if there are no writable memory blocks in the second area during the operation to determine if the target data is to be written to the first area, written to the portion of the first area that does not overlap with the second area where there are writable memory blocks in the portion of the first area that does not overlap with the second area, wherein the number of data bits stored per memory cell in the first area is less than the number of data bits stored per memory cell in the third area, and wherein, when there are writable memory blocks in the second area and when the number of free memory blocks in the first area or the third area is equal to or greater than a first threshold number of free memory blocks or a size of a first writable area in the first area is equal to or larger than a first threshold area size, a) whether the target data is to be written to the first area and b) whether the target data is to be written to the third area is determined based on at least one of i) a valid data percentage indicating a percentage of an area in which valid data to be requested by a host is stored in each of the first area and the third area and ii) a size of a second writable area in the second area.

* * * * *